United States Patent
Dallaire-Demers et al.

(10) Patent No.: US 11,106,993 B1
(45) Date of Patent: Aug. 31, 2021

(54) COMPUTER SYSTEMS AND METHODS FOR COMPUTING THE GROUND STATE OF A FERMI-HUBBARD HAMILTONIAN

(71) Applicant: Zapata Computing, Inc., Boston, MA (US)

(72) Inventors: Pierre-Luc Dallaire-Demers, Toronto (CA); Yudong Cao, Cambridge, MA (US); Amara Katabarwa, Cambridge, MA (US); Jerome Florian Gonthier, Cambridge, MA (US); Peter D. Johnson, Somerville, MA (US)

(73) Assignee: Zapata Computing, Inc., Boston, MA (US)

( * ) Notice: Subject to any disclaimer, the term of this patent is extended or adjusted under 35 U.S.C. 154(b) by 0 days.

(21) Appl. No.: 17/033,727

(22) Filed: Sep. 26, 2020

Related U.S. Application Data

(60) Provisional application No. 62/907,142, filed on Sep. 27, 2019, provisional application No. 62/911,673, filed on Oct. 7, 2019, provisional application No. 62/983,022, filed on Feb. 28, 2020.

(51) Int. Cl.
*G06N 10/00* (2019.01)
*H03K 19/195* (2006.01)

(52) U.S. Cl.
CPC .......... *G06N 10/00* (2019.01); *H03K 19/195* (2013.01)

(58) Field of Classification Search
CPC .............................. G06N 10/00; H03K 19/195
USPC ......................................................... 706/62
See application file for complete search history.

(56) References Cited

U.S. PATENT DOCUMENTS

| | | | |
|---|---|---|---|
| 10,469,087 B1 | 11/2019 | Granade et al. | |
| 10,755,191 B2* | 8/2020 | Shim | G06N 10/00 |
| 2014/0187427 A1 | 7/2014 | Macready et al. | |
| 2015/0262072 A1 | 9/2015 | Stoltz | |
| 2016/0328253 A1 | 11/2016 | Majumdar | |
| 2017/0177751 A1 | 6/2017 | Macready et al. | |
| 2017/0262765 A1* | 9/2017 | Bourassa | H01L 39/223 |
| 2017/0351967 A1* | 12/2017 | Babbush | G06N 20/00 |
| 2018/0129965 A1 | 5/2018 | Bocharov et al. | |
| 2018/0232652 A1* | 8/2018 | Curtis | G06F 16/9024 |
| 2018/0330264 A1 | 11/2018 | Lanting et al. | |
| 2019/0147359 A1 | 5/2019 | Chen et al. | |
| 2019/0205783 A1 | 7/2019 | Nam et al. | |
| 2019/0236476 A1 | 8/2019 | Pereverzev | |

(Continued)

FOREIGN PATENT DOCUMENTS

| | | |
|---|---|---|
| KR | 20120016381 A | 2/2012 |
| WO | 2017027185 A1 | 2/2017 |

(Continued)

OTHER PUBLICATIONS

Arute, F., et al., "Quantum supremacy using a programmable superconducting processor", pp. 505-510 (Oct. 23, 2019).

(Continued)

*Primary Examiner* — Don P Le
(74) *Attorney, Agent, or Firm* — Blueshift IP, LLC; Robert Plotkin

(57) ABSTRACT

A quantum computer or a hybrid quantum-classical (HQC) computer leverages the power of noisy intermediate-scale quantum (NISQ) superconducting quantum processors at and/or beyond the supremacy regime to evaluate the ground state energy of an electronic structure Hamiltonian.

20 Claims, 7 Drawing Sheets

(56) References Cited

U.S. PATENT DOCUMENTS

| | | | |
|---|---|---|---|
| 2020/0394537 A1 | 12/2020 | Wang et al. | |
| 2020/0394549 A1* | 12/2020 | Dallaire-Demers | G06N 10/00 |
| 2021/0034998 A1 | 2/2021 | Cao et al. | |
| 2021/0073668 A1 | 3/2021 | Dallaire-Demers | |
| 2021/0125096 A1* | 4/2021 | Puri | G06N 10/00 |

FOREIGN PATENT DOCUMENTS

| | | |
|---|---|---|
| WO | 2019050555 A1 | 3/2019 |
| WO | 2019126644 A1 | 6/2019 |
| WO | 2020252425 A1 | 12/2020 |
| WO | 2021022217 A1 | 2/2021 |
| WO | 2021046495 A1 | 3/2021 |
| WO | 2021062331 A1 | 4/2021 |

OTHER PUBLICATIONS

Baker, J.M., et al., "Decomposing Quantum Generalized Toffoli with an Arbitrary Numbers of Ancilla", arXiv:1904.01671v1, pp. 1-10 (Apr. 2, 2019).

Balu, R. and Borle, A., "Bayesian Networks based Hybrid Quantum-Classical Machine Learning Approach to Elucidate Gene Regulatory Pathways", arXiv:1901.10557v1, pp. 1-9 (Jan. 23, 2019).

Bao, N., et al., "Universal Quantum Computation by Scattering in the Fermi-Hubbard model", arXiv:1409.3585v2, pp. 1-9 (Sep. 15, 2014).

Barenco, A., et al., "Elementary Gates for Quantum Computation", arXiv:quant-ph/9503016v1, pp. 1-31 (Mar. 23, 1995).

Bedürftig, G., and Frahm, H., "Spectrum of boundary states in the open Hubbard chain", arXiv:cond-mat.9702227v1, pp. 1-14 (Feb. 26, 1997).

Brassard, G., et al., "Quantum Amplitude Amplification and Estimation", arXiv:quant-ph/0005055v1, pp. 1-22 (May 15, 2000).

Bravyi, S., "Lagrangian Representation for Fermionic Linear Optics", arXiv:quant-ph/0404180v2, pp. 1-12(Sep. 20, 2004).

Cao, Y., et al., "Quantum Chemistry in the Age of Quantum Computing", Quantum Physics, arXiv:1812.09976v2, pp. 1-194 (Dec. 28, 2018).

Dallaire-Demers, P. L., et al., "An application benchmark for fermionic quantum simulations", arXiv:2003.01862v1, pp. 1-14 (Mar. 4, 2020).

Dallaire-Demers, P.L., and Killoran, N., "Quantum generative adversarial networks", arXiv:1804.08641v2, Phys. Rev. A, vol. 98, 012324, pp. 1-10 (Apr. 30, 2018).

Dallaire-Demers, P.L., et al., "Low-depth circuit ansatz for preparing correlated fermionic states on a quantum computer", arXiv preprint arXiv:1801.01053v1, pp. 1-15 (Jan. 3, 2018).

Dallaire-Demers, P.L., et al., "Low-depth circuit ansatz for preparing correlated fermionic states on a quantum computer", Quantum Physics, arXiv:1801.01053v1, pp. 1-15 (Jan. 3, 2018).

Dallaire-Demers, P.L., et al., "Quantum Generative Adversarial Networks", Quantum Physics, pp. 1-10 (Apr. 30, 2018).

Essler, F. H. L., et al., "The one-dimensional Hubbard model", Cambridge University Press, pp. 1-753 (Dec. 11, 2003).

Esslinger, T., "Fermi-Hubbard physics with atoms in an optical lattice", arXiv:1007.0012v1, pp. 1-29 (Jun. 30, 2010).

Fedorov, A., et al., "Implementation of a Toffoli Gate with Superconducting Circuits", arXiv:1108.3966v1, pp. 1-5 (Aug. 19, 2011).

Ferrie, C., et al., "How to Best Sample a Periodic Probability Distribution, or on the Accuracy of Hamiltonian Finding Strategies", Quantum Information Processing, arXiv:1110.3067v1, pp. 1-8 (Oct. 13, 2011).

Figgat, C., et al., "Complete 3-Qubit Grover search on a programmable quantum computer", Nature Communications, vol. 8, Article No. 1918, pp. 1-9 (2017).

Ghamami, S., and Zhang, B., et al., "Efficient Monte Carlo Counterparty Credit Risk Pricing and Measurement", Journal of Credit Risk, vol. 10, No. 3, pp. 1-42 (Jul. 23, 2014).

Grover, L.K., "A fast quantum mechanical algorithm for database search", STOC '96: Proceedings of the twenty-eighth annual ACM symposium on Theory of Computing, pp. 1-8 (Jul. 1996).

Hoyer, P., et al., "On Arbitrary Phases in Quantum Amplitude Amplification", arXiv:quant-ph/0006031v1, pp. 1-6 (Jun. 7, 2000).

International Search Report & Written Opinion dated Dec. 11, 2020, in international patent application No. PCT/US2020/049605, 14 pages.

International Search Report & Written Opinion dated Jan. 5, 2021, in international patent application No. PCT/US2020/052958, 7 pages.

International Search Report & Written Opinion dated Nov. 6, 2020, in international patent application No. PCT/US2020/044615, 8 pages.

International Search Report and Written Opinion dated Sep. 21, 2020, in international patent application No. PCT/US2020/037655, pp. 1-8.

Johnson, P. D., et al., "QVECTOR: an algorithm for device-tailored quantum error correction", arXiv preprint arXiv:1711.02249v1, pp. 1-16 (Nov. 7, 2017).

Kaushal, V., et al., "Shuttling-based trapped-ion quantum information processing", AVS Quantum Science, vol. 2, No. 1, pp. 1-25 (2020).

Kitaev, A.Y., "Quantum Measurements and the Abelian Stabilizer Problem", arXiv preprint quant-ph/9511026, pp. 1-22 (Nov. 20, 1995).

Kjaergaard, M., et al., "Superconducting Qubits: Current State of Play", arXiv:1905.13641v2, pp. 1-28 (Jul. 26, 2019).

Knill, E., et al., "Optimal Quantum Measurements of Expectation Values of Observables", arXiv quant-ph/0607019v1, pp. 1-22 (Jul. 3, 2006).

Krantz, P., et al., "A Quantum Engineer's Guide to Superconducting Qubits", Applied Physics Reviews, vol. 6, No. 2, 021318, pp. 1-59 (2019).

Lee, S.J.R., et al., "Analytical Gradients for Projection-Based Wavefunction-in-DFT Embedding", arXiv:1903.05830v3, pp. 1-15 (Aug. 19, 2019).

Long, G.L., et al, "Phase Matching in Quantum Searching", arXiv:quant-ph/9906020v1, pp. 1-13 (Jun. 5, 1999).

Low, G.H., and Chuang, I.L., "Optimal Hamiltonian Simulation by Quantum Signal Processing", arXiv:1606.02685v2, pp. 1-6 (Dec. 20, 2016).

Low, G.H., et al., "Methodology of Resonant Equiangular Composite Quantum Gates", Physical Review X, vol. 6, No. 1, pp. 1-13 (2016).

Manby, F.R., et al., "A simple, exact density-functional-theory embedding scheme", Journal of Chemical Theory and Computation, pp. 2564-2568(Jul. 17, 2012).

Maslov, D., "Basic Circuit Compilation Techniques for an Ion-Trap Quantum Machine", https://arxiv.org/pdf/1603.07678v4, pp. 1-18 (Feb. 21, 2017).

McClean, J. R., et al., "The theory of variational hybrid quantum-classical algorithms", New Journal of Physics, vol. 18, pp. 1-22 (Feb. 5, 2016).

Mølmer, K., and Sørensen, A., "Multiparticle entanglement of hot trapped ions", arXiv:quant-ph/9810040v2, pp. 1-4 (Jan. 26, 1999).

Motta, M., et al., "Low rank representations for quantum simulation of electronic structure", Computational Physics, Quantum Physics, arXiv:1808.02625v2, pp. 1-8 (Aug. 9, 2018).

Nielsen, A. M., et al, "Quantum Computation as Geometry", arXiv:quant-ph/0603161v2, pp. 1-13 ( Mar. 21, 2006).

Nielsen, M. A., and Chuang, I. L., "Quantum Computation and Quantum Information", Cambridge University Press, pp. 1-704 (2000).

Pino, J.M., et al., "Demonstration of the QCCD trapped-ion quantum computer architecture", arXiv:2003.01293, pp. 1-11 (Sep. 26, 2020).

Potthoff, M., "Chapter 1: Self-energy-functional theory", arXiv:1108.2183, pp. 1-38 (Aug. 10, 2011).

Rodriguez-Lujan, I., et al., "Quadratic Programming Feature Selection", The Journal of Machine Learning Research, vol. 11, pp. 1491-1516 (2010).

(56) References Cited

OTHER PUBLICATIONS

Romero, J., and Aspuru-Guzik, A., "Variational quantum generators: Generative adversarial quantum machine learning for continuous distributions", Quantum Physics, arXiv:1901.00848 [quant-ph], pp. 1-15 (Jan. 3, 2019).
Romero, J., et al., "Quantum autoencoders for efficient compression of quantum data", Quantum Science and Technology, arXiv:1612.02806v2, vol. 2, No. 4, pp. 1-10 (Feb. 10, 2017).
Romero, J., et al., "Quantum autoencoders for efficient compression of quantum data", Quantum Science and Technology, vol. 2 (4):045001, pp. 1-10 (Feb. 10, 2017).
Romero, J., et al., "Strategies for quantum computing molecular energies using the unitary coupled cluster ansatz", Quantum Science and Technology, arXiv:1701.02691v2, vol. 4, No. 1, pp. 1-18 (Feb. 10, 2018).
Schuch, N. and Verstraete, F., "Computational Complexity of interacting electrons and fundamental limitations of Density Functional Theory", Nature Physics, DOI: 10.1038/NPHYS1370, pp. 732-735 (Aug. 23, 2009).
Schuld, M., et al., "Circuit-centric quantum classifiers", arXiv:1804.00633v1, pp. 1-17 (Apr. 2, 2018).
Sepiol, M.A., "A High-Fidelity Microwave Driven Two-Qubit Quantum Logic Gate in 43Ca+", pp. 1-197 (2016).
Sergeevich, A., et al., "Characterization of a Qubit Hamiltonian Using Adaptive Measurements in a Fixed Basis", arXiv:1102.3700v2, pp. 1-6 (Nov. 23, 2011).
Verstraete, F., et al., "Quantum Circuits for Strongly Correlated Quantum Systems", arXiv:0804.1888v1, pp. 1-5 (Apr. 11, 2008).
Wang, D., et al., "Accelerated Variational Quantum Eigensolver", arXiv:1802.00171v3, pp. 1-11 (Mar. 25, 2019).
Wang, G., et al., "Bayesian Inference with Engineered Likelihood Functions for Robust Amplitude Estimation", arXiv:2006.09350v2, pp. 1-62 (Jun. 26, 2020).
Wiebe, N., and Granade, C., "Efficient Bayesian Phase Estimation", arXiv:1508.00869v1, pp. 1-12 (Aug. 4, 2015).
Andersen, C.K., et al., "Entanglement Stabilization using Parity Detection and Real-Time Feedback in Superconducting Circuits", arXiv:1902.06946v2, pp. 1-12 (Feb. 20, 2019).
Baekkegaard, T., et al., "Realization of efficient quantum gates with a superconducting qubit-qutrit circuit", Scientific Reports, vol. 9, Article No. 13389, pp. 1-10 (Sep. 16, 2019).
Cao, Y., et al., "Implementation of a Toffofi gate using an array of coupled cavities in a single step", Scientific Reports, vol. 8, Article No. 5813, pp. 1-10 (Apr. 11, 2018).
International Search Report and Written Opinion dated Mar. 15, 2021, in International Patent Application No. PCT/US2020/061631, 07 pages.
A. Barenco et al., "Elementary Gates for Quantum Computation," Physical review A, 52(5), Mar. 1995, 31 pages.
A.Y. Kitaev "Quantum Measurements and the Abelian Stabilizer Problem," arXiv preprint quant-ph/9511026, Nov. 1995, 22 pages.
L.K. Grover "A fast quantum mechanical algorithm for database search," arXiv preprint quant-ph/9605043, May 1996, 8 pages.
E. Knill et al., "Optimal Quantum Measurements of Expectation Values of Observables," Physical Review A, 75(1), Jan. 2007, p. 012328.
P.L. Dallaire-Demers et al., "Quantum Generative Adversarial Networks," Physical Review A, 98(1), Apr. 2018, p. 012324.

\* cited by examiner

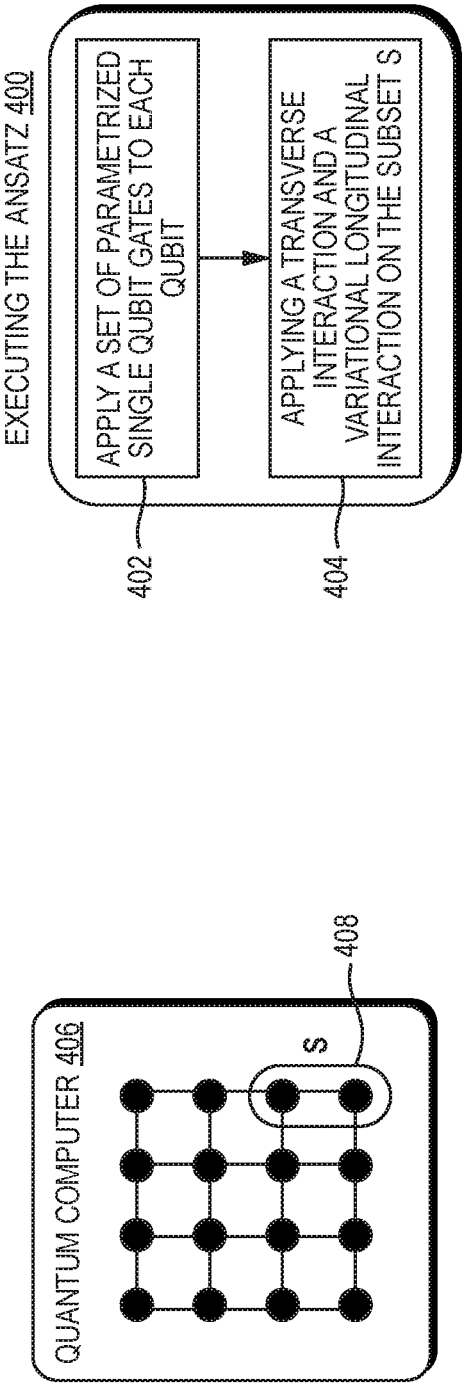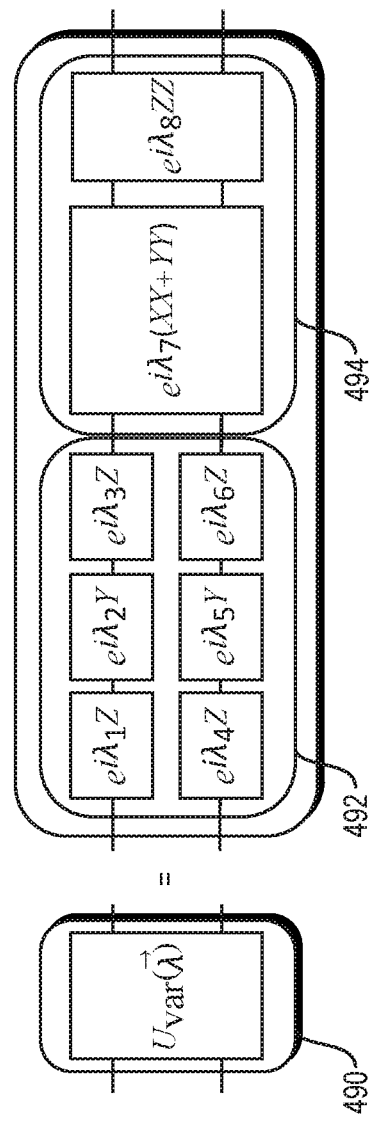
FIG. 4A
FIG. 4B
FIG. 4C

COMPUTER SYSTEMS AND METHODS FOR COMPUTING THE GROUND STATE OF A FERMI-HUBBARD HAMILTONIAN

SUMMARY

A quantum computer or a hybrid quantum-classical (HQC) computer leverages the power of noisy intermediate-scale quantum (NISQ) superconducting quantum processors at and/or beyond the supremacy regime to evaluate the ground state energy of the electronic structure Hamiltonian.

BRIEF DESCRIPTION OF THE DRAWINGS

FIG. 4A illustrates a plurality of qubits according to one embodiment of the present invention;

FIG. 4B illustrates a method implemented according to one embodiment of the present invention;

FIG. 4C illustrates a quantum circuit for implementing the method of FIG. 4B according to one embodiment of the present invention;

DETAILED DESCRIPTION

Embodiments of the present invention include a method of executing a quantum circuit, performed by a quantum computer with a plurality P of subsets S of a plurality of qubits, each of the plurality of subsets comprising at least two qubits. The method applies parametrized single qubit gates followed by a variational transverse interaction (XX+YY) and a variational longitudinal interaction (ZZ), as shown in FIG. 4B. Alternatively, the order of the two-qubit variational gates XX+YY and ZZ may be reversed. These gates may, for example, be implemented with the tunable couplers of the Sycamore processor.

Embodiments of the present invention may include a final layer of variational single qubit gates at the end of the ansatz. The quantum circuit, also referred to as a variational gate, may be chosen such that composing two such operations in sequence may be used to generate arbitrary single qubit rotations. This may be done, for example, by applying single-qubit X on the first and second qubit, respectively, at the beginning of the gate and by applying the single-qubit Z rotations at the end of the gate. The Z rotations may also be generators for local fermionic Gaussian transformations. The composition of a sequence of variational elements may be used to construct a set of gates which is universal for quantum computing.

Figure 6:
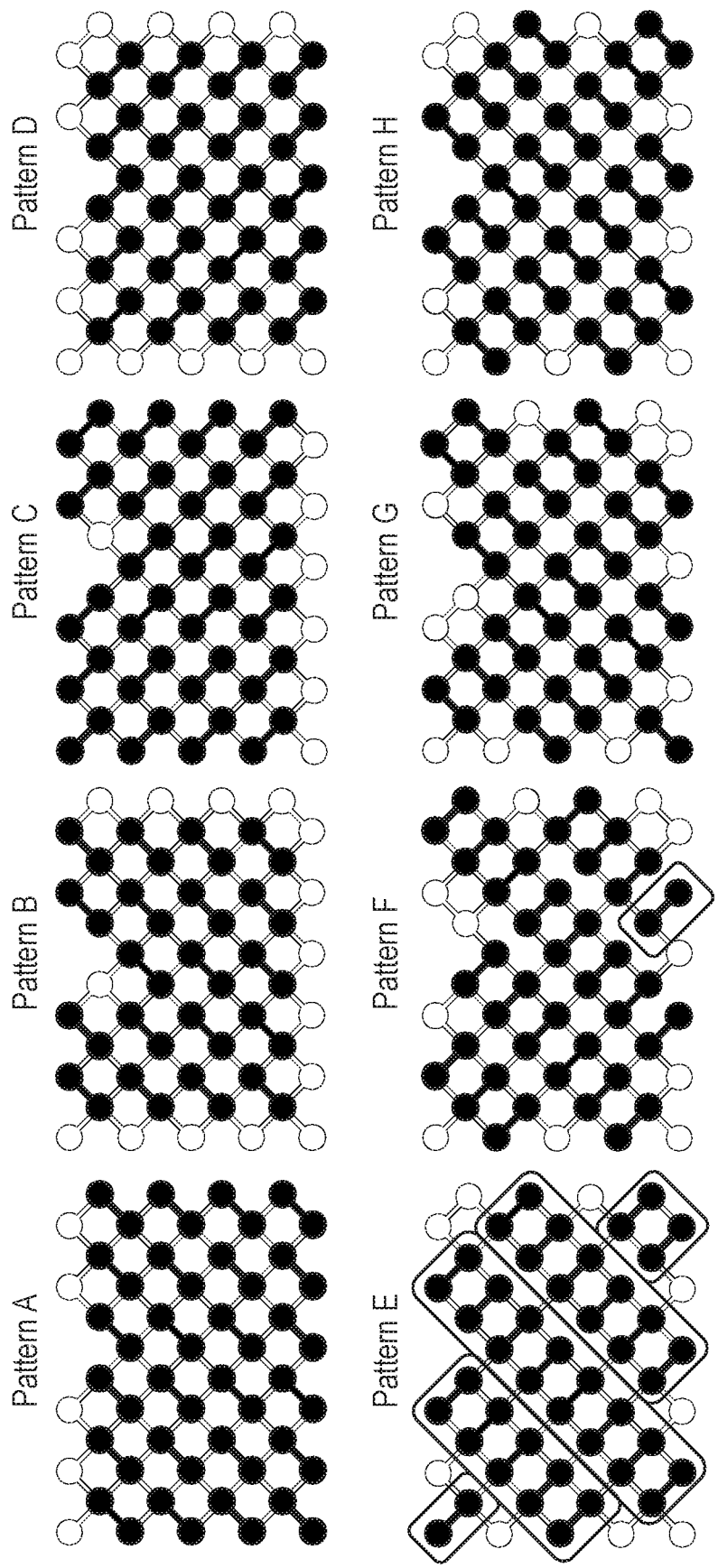
FIG. 6 illustrates staggered patterns of variational 2-qubit gates which are used by certain embodiments of the present invention.

Embodiments of the present invention may build an ansatz by layering staggered patterns of variational 2-qubit gates. Various sequences of patterns may be used, such as, for example, those shown in FIG. 6. For example, the ansatz may be constructed by repeating the pattern ABCDEFGH. As of September 2019, the supremacy regime may be demonstrated by stacking 20 of those layers. For VQE applications, the number of layers of the ansatz will typically be similar to or larger than the number required for supremacy experiments. The maximum number of layers that can be used is limited by the maximum coherent depth (approximately the ratio of the coherence time $T_2$ over the gate time). Embodiments of the present invention may also start from a lower number of layers and iteratively add new layers either until convergence of the energy to a desired accuracy or until there is so much noise that the output samples become uncorrelated with the circuit parameters.

As an example, we consider the details of such benchmark for the quantum processor recently produced by the team at Google (the Sycamore processor). By parametrizing the pulses used to operate the tunable couplers and the qubit frequencies, it is possible to use the Sycamore device as a variational ansatz. It has been demonstrated experimentally that variational 2-qubit gates can be implemented. Each parametrized two-qubit gate has two components: an exchange term and a tunable dispersive interaction. Embodiments of the present invention may define a practical variational building block by starting each step with a variable X rotation to select a basis and by adding tunable Z phases at the end of each step to compensate for stray phase-shifts. A variational layer is composed of many parallel 2-qubit elements which are parametrized such that the experimental implementation of each layer is completed in a fixed time. This allows a simple multilayer composition of the ansatz. By construction the ansatz may interpolate between discrete elements of the class of random circuits used for the supremacy demonstration. All single-qubit gates may be reached by the ansatz as well as two-qubit cphase operations and nonnearest-neighbor matchgates which are both universal for quantum computing. The ansatz may also be used to represent and study fermionic states beyond the reach of classical computers.

Embodiments of the present invention are directed to a quantum computer or a hybrid quantum-classical (HQC) computer which leverages the power of noisy intermediate-scale quantum (NISQ) superconducting quantum processors at and/or beyond the supremacy regime to evaluate the ground state energy of the electronic structure Hamiltonian $$H(T, V) = i\sum_{p,q} T^{pq}\gamma_p\gamma_q + \sum_{p,q,r,s} V^{pqrs}\gamma_p\gamma_q\gamma_r\gamma_s$$

where the $\gamma$'s are Majorana operators. Note that this Hamiltonian is strictly equivalent to the second quantized Hamiltonian of quantum chemistry.

Embodiments of the present invention may be used to prepare a hardware-efficient ansatz for quantum processors, such as Google's Sycamore quantum processor. For example, embodiments of the present invention may take the class of random circuits that have been used to demonstrate quantum supremacy and modify those circuits to make them into variational circuits. The resulting variational random circuits correspond to specific assignments of variational parameters.

For example, embodiments of the present invention may, as a starting point, calculate the mean-field energy of the ground state of H(T,V) and compute the corresponding covariance matrix Γ of this state and obtain the Bogoliubov transformation $U_{Bog}$ such that the quantum processor can be initialized in the product state $$|\Phi_0\rangle = \bigotimes_k X_k^{\frac{1+\lambda_k}{2}} |0\rangle,$$

where the $\lambda_k$ are the Williamson eigenvalues of $\Gamma$. (See, e.g., https://arxiv.org/abs/quant-ph/0404180.)

Alternatively, for example, embodiments of the present invention may find a basis that maximizes the overlap with the state coming from an MP2 calculation or a coupled cluster calculation. This may be performed, for example, by using the natural orbitals coming from an MP2/coupled-cluster.

Embodiments of the present invention may then execute a Variational Quantum Eigensolver (VQE) algorithm on $H'=U_{Bog}HU_{Bog}^\dagger$ with the ansatz described below. Qubitwise grouping may be used to reduce the number of measurements required to estimate the expectation value of the energy. Given enough coherence, the techniques disclosed in Guoming Wang, et al., "Bayesian Inference with Engineered Likelihood Functions for Robust Amplitude Estimation" (available online at https://arxiv.org/abs/2006.09350 and incorporated by reference herein)" may also be used to reduce the amount of sampling.

Embodiments of the present invention may use natural gradients to find the minimal energy. The quantum geometric tensor depends only on the structure of the ansatz and not on the specific Hamiltonian.

Embodiments of the present invention may, for example, simplify some patterns based on the occupation of the initial state. For example, because only the occupied-unoccupied mixings improve the energy, two unoccupied basis functions may not be mixed, and two occupied basis functions may not be mixed.

Embodiments of the present invention may also improve the convergence of a hardware-efficient ansatz, for example by ordering occupied orbitals in an optimal way to favor important mixings. This is even more advantageous on a 2D architecture, in which it is possible to make an orbital interact with up to four neighbors directly.

Embodiments of the present invention may determine if the ansatz is deep enough to simulate a given Hamiltonian. For example, embodiments of the present invention may compute an expected distance of the ground state of a given H(T,V) with respect to the accessible region of the finite depth ansatz. The distance is given by a functional F(H(T, V)) of the moments of the coefficients T and V. To define a decision boundary, embodiments of the present invention may use a support vector machine or a circuit classifier. For simplicity, the function may be restricted to the first and second order moments (mean and variance) of the coefficient T and V. The size of the accessible region of Hilbert space increases with the depth of the ansatz.

Embodiments of the present invention may implement a benchmark. The effective fermionic length (EFL) corresponds to the maximum length of a 1D FHM for which a quantum device implementing a hardware-efficient ansatz provides the best estimate of the infinite chain energy density. The accuracy of this estimate will also depend on the performance of the VQE procedure, which is influenced by the quality of the VQE optimization. In this sense, $L_-$ can be interpreted as a holistic metric describing both the power of a quantum device as an ansatz for simulating fermionic systems with VQE and the quality of the VQE procedure itself. Hence, the EFL may itself be a useful benchmark.

Correspondingly, gradient-based optimization is feasible for a hardware efficient ansatz with few layers. To take advantage of this, embodiments of the present invention may execute a layer-by-layer optimization strategy to carry out the optimization. Such optimization may start by optimizing O(log(n)) layers by randomly initializing the parameters. Convergence is achieved after a certain threshold of change in energy between two optimizations is met or when a maximum number of function evaluations is reached. This first optimization step provides an approximation to the wavefunction with non-zero overlap with the exact ground state. After completing the first optimization, embodiments of the present invention may increment the number of layers, initializing the new layers according to some random distribution of parameters and retaining the optimal parameters for the old layers. Embodiments of the present invention may use a small interval of angles such that the identity may be recovered but initial symmetries are broken. New layers and the layers from the previous steps are trained using a numerical optimizer. Embodiments of the present invention may repeat this procedure until achieving an energy convergence within a predefined global threshold. By doing the optimization sequentially, embodiments of the present invention may approximately guarantee that the starting point for each iteration maintains significant overlap with the ground state.

Note that if the number of orbitals to be simulated by embodiments of the present invention is smaller than the total number of qubits in the quantum computer (e.g., the quantum computer 252 in FIG. 2A), the ansatz may still be defined for all qubits of the quantum computer, but the expectation value of the Hamiltonian may only be measured on the subset of qubits that encodes the orbitals. In this case, the remaining qubits may essentially act as quantum error correction ancilla (see Peter D. Johnson, et al., "QVECTOR: an algorithm for device-tailored quantum error correction," available online at https://arxiv.org/abs/1711.02249 and incorporated by reference herein) and thereby increase the fidelity of the variational ground state.

For example, if the quantum computer includes 53 qubits and the encoding of a molecule requires only 40 qubits, then embodiments of the present invention may encode the full ansatz on 53 qubits and measure the expectation value of the Hamiltonian on 40 qubits. This will push the entropy toward the unmeasured 13 qubits and improve the fidelity of the simulation since the minimum of the optimization has to yield a pure state.

If the number of qubits in the quantum computer is greater than the number of orbitals to be simulated, then it may be useful to choose the subset of qubits that have the lowest one- and two-qubit errors (from randomized benchmarking) to encode the system.

Embodiments of the present invention may, for example, construct the Hamiltonian from a FermiNet deep neural network.

Figure 5A:
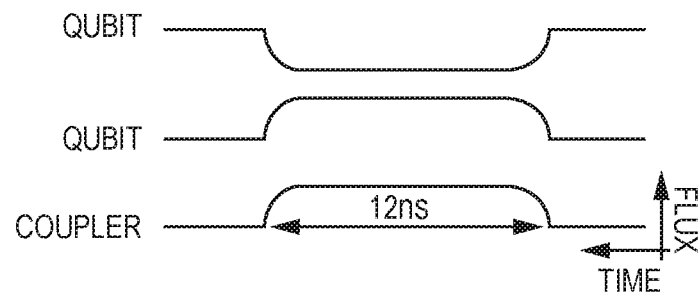
FIGS. 5A-5C are diagrams of 2-qubit gates used by Google for the supremacy demonstration of the Sycamore quantum computer.
Figure 5B:
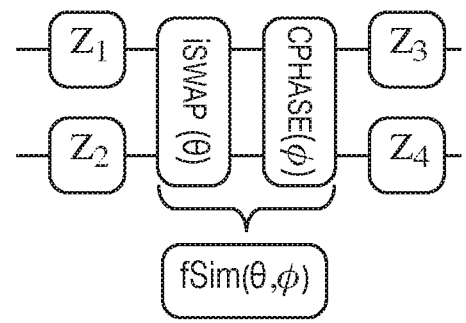
Figure 5C:
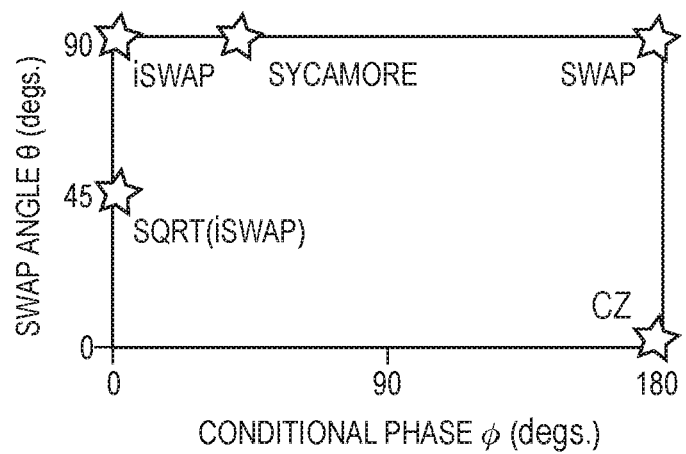

FIGS. 5A-5C illustrate the 2-qubit gates used by Google for the supremacy demonstration of the Sycamore device. Embodiments of the present invention may be implemented using the technology shown in FIGS. 5A-5C.

In practice, the experimental controls may influence other neighboring gates through residual electromagnetic interactions, namely cross-talk. This means that the mapping between experimental control parameters and the variational angles of the ideal two-qubit gates is not perfectly local. However, for a given assignment of control parameters at a given time, the cross-talk has a reproducible coherent component acting on the computational Hilbert space.

Embodiments of the present invention may include executing the optimization directly on the experimental controls, as it could help mitigate the effect of coherent errors. The maximum pulse duration tend and amplitude max are chosen to approximate an iSWAP for a full pulse. The pulses all have the same maximal duration to allow for the composition of layers of variational two-qubit gates that are executed synchronously. The variational single-qubit Z rotations at the end of the two-qubit element can compensate for frequency shifts induced by flux controls.

Embodiments of the present invention may also utilize a translationally invariant system or approximately translationally invariant system. Such a system includes a long series of sites, or subsystems, which are linked identically via some interaction. The property of being translationally invariant indicates that a shift of the system in one or more directions is identical to the original system. An example of a translationally invariant system is an infinitely long 1D chain of hydrogen atoms with a fixed interaction strength between nearest neighbors. (Note that 2D or 3D lattices may also have the same property.) Such a system could be considered approximately translationally invariant if the chain is long but finite; this is because a translational shift only affects the endpoints of the chain.

In general, the sites themselves may consist of more complicated subsystems, so long as the translationally invariant property remains between sites. To prepare an approximate ground state of the entire system, embodiments of the present invention may first find a representation of a single site on one or more qubits. Once the representation is chosen, embodiments of the present invention may create the system by applying the following steps:

(A) Prepare the ground state using a variational quantum eigensolver (VQE) or an equivalent technique on a subsystem consisting of one or more sites. Denote this as the "composite system" and the resulting ground state preparation circuit as the "composite circuit".

(B) Using the composite circuit from step (A), prepare identical copies of the composite system.

(C) "Join" two composite systems by finding the ground state (again using VQE or an equivalent technique) of a pair of composite systems. The circuit used to find this ground state will initially include two copies of the composite circuit from step (A). Additional gates are interwoven between qubits representing neighboring sites of the composite systems.

(D) Preparing, using the circuit discovered in step (C), multiple copies of this new composite system.

(E) Repeat steps (C)-(D), thereby creating increasingly larger composite systems, until the entirety of the translationally invariant system is captured. Additional steps may be performed to join composite systems of unequal size if the number of sites is, e.g., odd. The same method of Step (C) can be used, except that the initial circuits preparing the composite systems will differ.

Referring to FIG. 4B, a flowchart is shown of a method 400 that is performed by a quantum computer (e.g., the quantum computer 102), or a hybrid quantum-classical computer (e.g., the hybrid quantum-classical computer 300) according to one embodiment of the present invention. The method 400 executes a Fermi-Hubbard ansatz on the quantum computer. As described elsewhere herein, the quantum computer includes a plurality of qubits, such as the plurality of qubits shown in the quantum computer 406 of FIG. 4A.

The method 400 includes: (A) executing the Fermi-Hubbard ansatz by applying, on the quantum computer, a variational circuit on a plurality P of subsets S of the plurality of qubits. An example of such a subset S is shown as subset 408 in FIG. 4A. Each of the plurality of subsets may include at least two qubits.

Executing the circuit may include, for each subset S: (A)(1) applying a first set of parametrized single qubit gates to each qubit in the subset S (FIG. 4B, operation 402); and (A)(2) applying a transverse interaction and a variational longitudinal interaction on the subset S (FIG. 4B, operation 404). FIG. 4C illustrates a quantum circuit 490 which may implement the method 400 of FIG. 4B. The quantum circuit 490 may, for example, include a first sub-circuit 492 which implements operation 402 and a second sub-circuit 494 which implements operation 404.

Executing the circuit may further include: (A)(3) after (A)(2), applying a second set of parameterized single qubit gates to each qubit in the subset S.

The plurality of qubits P (e.g., the plurality of qubits shown in FIG. 4A) may include staggered layers of 2-qubit gates.

The method may further include: (B) after executing the Fermi-Hubbard ansatz, estimating the ground state energy of an electronic structure Hamiltonian to produce an estimate of the ground state energy of an electronic structure Hamiltonian. The electronic structure Hamiltonian may be a 1D Fermi-Hubbard Hamiltonian. The method may further include: (C) based on the estimate of the ground state energy of the 1D Fermi-Hubbard Hamiltonian, computing an effective fermionic length of the quantum computer.

The method may further include: (B) after executing the Fermi-Hubbard ansatz, evaluating the ground state energy of an electronic structure Hamiltonian to produce an evaluation of the ground state energy of the electronic structure Hamiltonian. The electronic structure Hamiltonian may be a 1D Fermi-Hubbard Hamiltonian. The method may further include: (C) based on the evaluation of the ground state energy of the 1D Fermi-Hubbard Hamiltonian, computing an effective fermionic length of the quantum computer.

Executing the circuit may include executing the optimization directly on experimental controls of the quantum computer.

Another embodiment of the present invention is directed to a system comprising a non-transitory computer-readable medium having computer program instructions stored thereon. The computer program instructions are executable by at least one processor in a classical computer to control a quantum computer to perform a method for executing a Fermi-Hubbard ansatz. The quantum computer includes a plurality of qubits. The method includes: (A) executing the Fermi-Hubbard ansatz by applying, on the quantum computer, a variational circuit on a plurality P of subsets S of the plurality of qubits, each of the plurality of subsets comprising at least two qubits, wherein executing the circuit comprises, for each subset S, at the quantum computer: (A)(1) applying a first set of parametrized single qubit gates to each qubit in the subset S; and (A)(2) applying a transverse interaction and a variational longitudinal interaction on the subset S.

Executing the circuit further may further include, at the quantum computer: (A)(3) after (A)(2), applying a second set of parameterized single qubit gates to each qubit in the subset S.

The plurality P may include staggered layers of 2-qubit gates.

The method may further include: (B) at the quantum computer, after executing the Fermi-Hubbard ansatz, estimating the ground state energy of an electronic structure Hamiltonian to produce an estimate of the ground state energy of an electronic structure Hamiltonian. The electronic structure Hamiltonian may include a 1D Fermi-Hubbard Hamiltonian. The method may further include: (C) at the quantum computer, based on the estimate of the ground state energy of the 1D Fermi-Hubbard Hamiltonian, computing an effective fermionic length of the quantum computer.

The method may further include: (B) at the quantum computer, after executing the Fermi-Hubbard ansatz, evaluating the ground state energy of an electronic structure Hamiltonian to produce an evaluation of the ground state energy of the electronic structure Hamiltonian. The electronic structure Hamiltonian may include a 1D Fermi-Hubbard Hamiltonian. The method may further include: (C) at the quantum computer, based on the evaluation of the ground state energy of the 1D Fermi-Hubbard Hamiltonian, computing an effective fermionic length of the quantum computer.

Executing the circuit may include executing the optimization directly on experimental controls of the quantum computer.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

Various physical embodiments of a quantum computer are suitable for use according to the present disclosure. In general, the fundamental data storage unit in quantum computing is the quantum bit, or qubit. The qubit is a quantum-computing analog of a classical digital computer system bit. A classical bit is considered to occupy, at any given point in time, one of two possible states corresponding to the binary digits (bits) 0 or 1. By contrast, a qubit is implemented in hardware by a physical medium with quantum-mechanical characteristics. Such a medium, which physically instantiates a qubit, may be referred to herein as a "physical instantiation of a qubit," a "physical embodiment of a qubit," a "medium embodying a qubit," or similar terms, or simply as a "qubit," for ease of explanation. It should be understood, therefore, that references herein to "qubits" within descriptions of embodiments of the present invention refer to physical media which embody qubits.

Each qubit has an infinite number of different potential quantum-mechanical states. When the state of a qubit is physically measured, the measurement produces one of two different basis states resolved from the state of the qubit. Thus, a single qubit can represent a one, a zero, or any quantum superposition of those two qubit states; a pair of qubits can be in any quantum superposition of 4 orthogonal basis states; and three qubits can be in any superposition of 8 orthogonal basis states. The function that defines the quantum-mechanical states of a qubit is known as its wavefunction. The wavefunction also specifies the probability distribution of outcomes for a given measurement. A qubit, which has a quantum state of dimension two (i.e., has two orthogonal basis states), may be generalized to a d-dimensional "qudit," where d may be any integral value, such as 2, 3, 4, or higher. In the general case of a qudit, measurement of the qudit produces one of d different basis states resolved from the state of the qudit. Any reference herein to a qubit should be understood to refer more generally to a d-dimensional qudit with any value of d.

Although certain descriptions of qubits herein may describe such qubits in terms of their mathematical properties, each such qubit may be implemented in a physical medium in any of a variety of different ways. Examples of such physical media include superconducting material, trapped ions, photons, optical cavities, individual electrons trapped within quantum dots, point defects in solids (e.g., phosphorus donors in silicon or nitrogen-vacancy centers in diamond), molecules (e.g., alanine, vanadium complexes), or aggregations of any of the foregoing that exhibit qubit behavior, that is, comprising quantum states and transitions therebetween that can be controllably induced or detected.

For any given medium that implements a qubit, any of a variety of properties of that medium may be chosen to implement the qubit. For example, if electrons are chosen to implement qubits, then the x component of its spin degree of freedom may be chosen as the property of such electrons to represent the states of such qubits. Alternatively, the y component, or the z component of the spin degree of freedom may be chosen as the property of such electrons to represent the state of such qubits. This is merely a specific example of the general feature that for any physical medium that is chosen to implement qubits, there may be multiple physical degrees of freedom (e.g., the x, y, and z components in the electron spin example) that may be chosen to represent 0 and 1. For any particular degree of freedom, the physical medium may controllably be put in a state of superposition, and measurements may then be taken in the chosen degree of freedom to obtain readouts of qubit values.

Certain implementations of quantum computers, referred as gate model quantum computers, comprise quantum gates. In contrast to classical gates, there is an infinite number of possible single-qubit quantum gates that change the state vector of a qubit. Changing the state of a qubit state vector typically is referred to as a single-qubit rotation, and may also be referred to herein as a state change or a single-qubit quantum-gate operation. A rotation, state change, or single-qubit quantum-gate operation may be represented mathematically by a unitary 2×2 matrix with complex elements. A rotation corresponds to a rotation of a qubit state within its Hilbert space, which may be conceptualized as a rotation of the Bloch sphere. (As is well-known to those having ordinary skill in the art, the Bloch sphere is a geometrical representation of the space of pure states of a qubit.) Multi-qubit gates alter the quantum state of a set of qubits. For example, two-qubit gates rotate the state of two qubits as a rotation in the four-dimensional Hilbert space of the two qubits. (As is well-known to those having ordinary skill in the art, a Hilbert space is an abstract vector space possessing the structure of an inner product that allows length and angle to be measured. Furthermore, Hilbert spaces are complete: there are enough limits in the space to allow the techniques of calculus to be used.)

A quantum circuit may be specified as a sequence of quantum gates. As described in more detail below, the term "quantum gate," as used herein, refers to the application of a gate control signal (defined below) to one or more qubits to cause those qubits to undergo certain physical transformations and thereby to implement a logical gate operation. To conceptualize a quantum circuit, the matrices corresponding to the component quantum gates may be multiplied together in the order specified by the gate sequence to produce a $2n \times 2n$ complex matrix representing the same overall state change on n qubits. A quantum circuit may thus be expressed as a single resultant operator. However, designing a quantum circuit in terms of constituent gates allows the design to conform to a standard set of gates, and thus enable greater ease of deployment. A quantum circuit thus corresponds to a design for actions taken upon the physical components of a quantum computer.

A given variational quantum circuit may be parameterized in a suitable device-specific manner. More generally, the quantum gates making up a quantum circuit may have an associated plurality of tuning parameters. For example, in embodiments based on optical switching, tuning parameters may correspond to the angles of individual optical elements.

In certain embodiments of quantum circuits, the quantum circuit includes both one or more gates and one or more measurement operations. Quantum computers implemented using such quantum circuits are referred to herein as implementing "measurement feedback." For example, a quantum computer implementing measurement feedback may execute the gates in a quantum circuit and then measure only a subset (i.e., fewer than all) of the qubits in the quantum computer, and then decide which gate(s) to execute next based on the outcome(s) of the measurement(s). In particular, the measurement(s) may indicate a degree of error in the gate operation(s), and the quantum computer may decide which gate(s) to execute next based on the degree of error. The quantum computer may then execute the gate(s) indicated by the decision. This process of executing gates, measuring a subset of the qubits, and then deciding which gate(s) to execute next may be repeated any number of times. Measurement feedback may be useful for performing quantum error correction, but is not limited to use in performing quantum error correction. For every quantum circuit, there is an error-corrected implementation of the circuit with or without measurement feedback.

Some embodiments described herein generate, measure, or utilize quantum states that approximate a target quantum state (e.g., a ground state of a Hamiltonian). As will be appreciated by those trained in the art, there are many ways to quantify how well a first quantum state "approximates" a second quantum state. In the following description, any concept or definition of approximation known in the art may be used without departing from the scope hereof. For example, when the first and second quantum states are represented as first and second vectors, respectively, the first quantum state approximates the second quantum state when an inner product between the first and second vectors (called the "fidelity" between the two quantum states) is greater than a predefined amount (typically labeled E). In this example, the fidelity quantifies how "close" or "similar" the first and second quantum states are to each other. The fidelity represents a probability that a measurement of the first quantum state will give the same result as if the measurement were performed on the second quantum state. Proximity between quantum states can also be quantified with a distance measure, such as a Euclidean norm, a Hamming distance, or another type of norm known in the art. Proximity between quantum states can also be defined in computational terms. For example, the first quantum state approximates the second quantum state when a polynomial time-sampling of the first quantum state gives some desired information or property that it shares with the second quantum state.

Not all quantum computers are gate model quantum computers. Embodiments of the present invention are not limited to being implemented using gate model quantum computers. As an alternative example, embodiments of the present invention may be implemented, in whole or in part, using a quantum computer that is implemented using a quantum annealing architecture, which is an alternative to the gate model quantum computing architecture. More specifically, quantum annealing (QA) is a metaheuristic for finding the global minimum of a given objective function over a given set of candidate solutions (candidate states), by a process using quantum fluctuations.

Figure 2A:
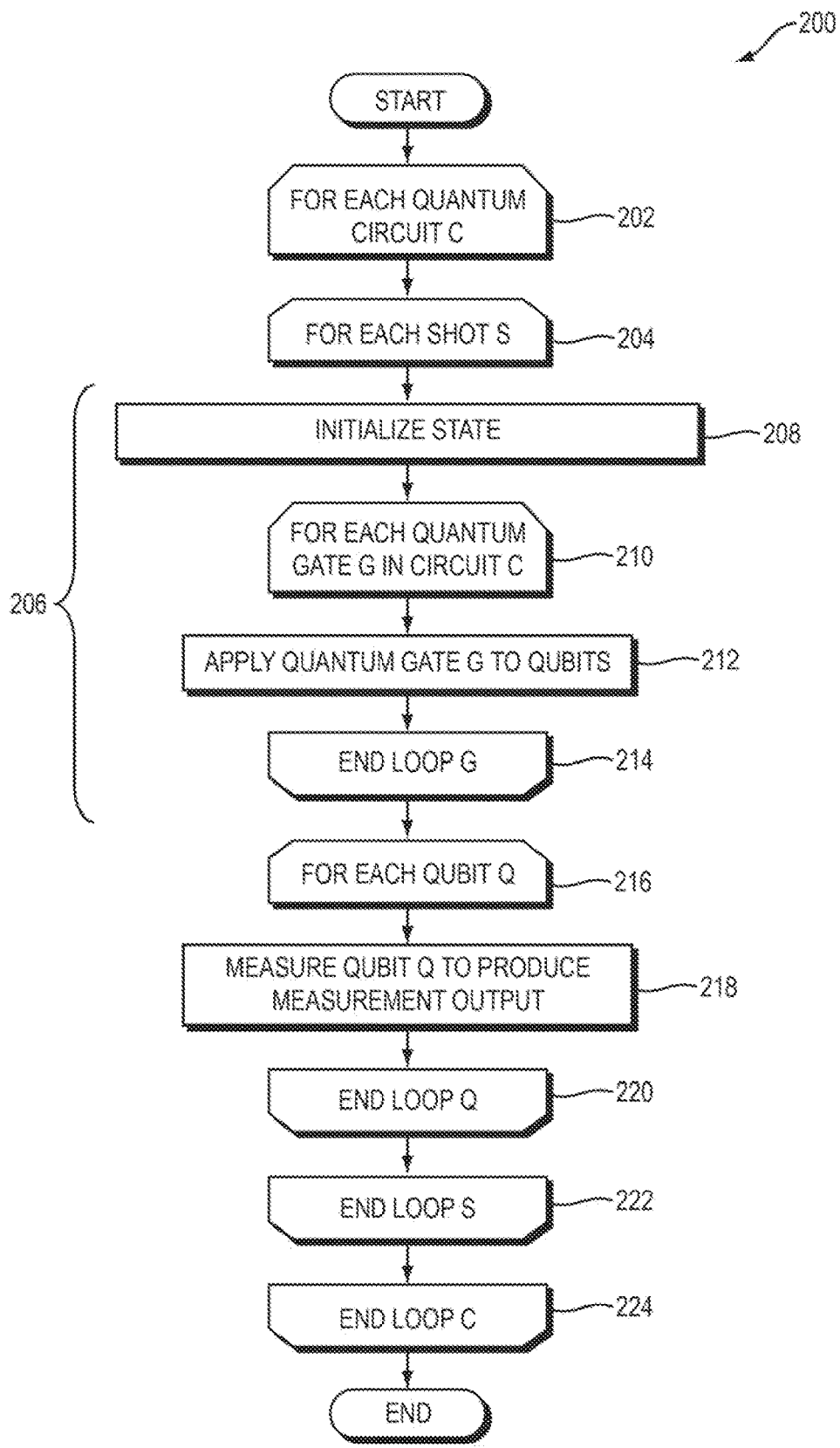
FIG. 2A is a flowchart of a method performed by the quantum computer of FIG. 1 according to one embodiment of the present invention.
Figure 2B:
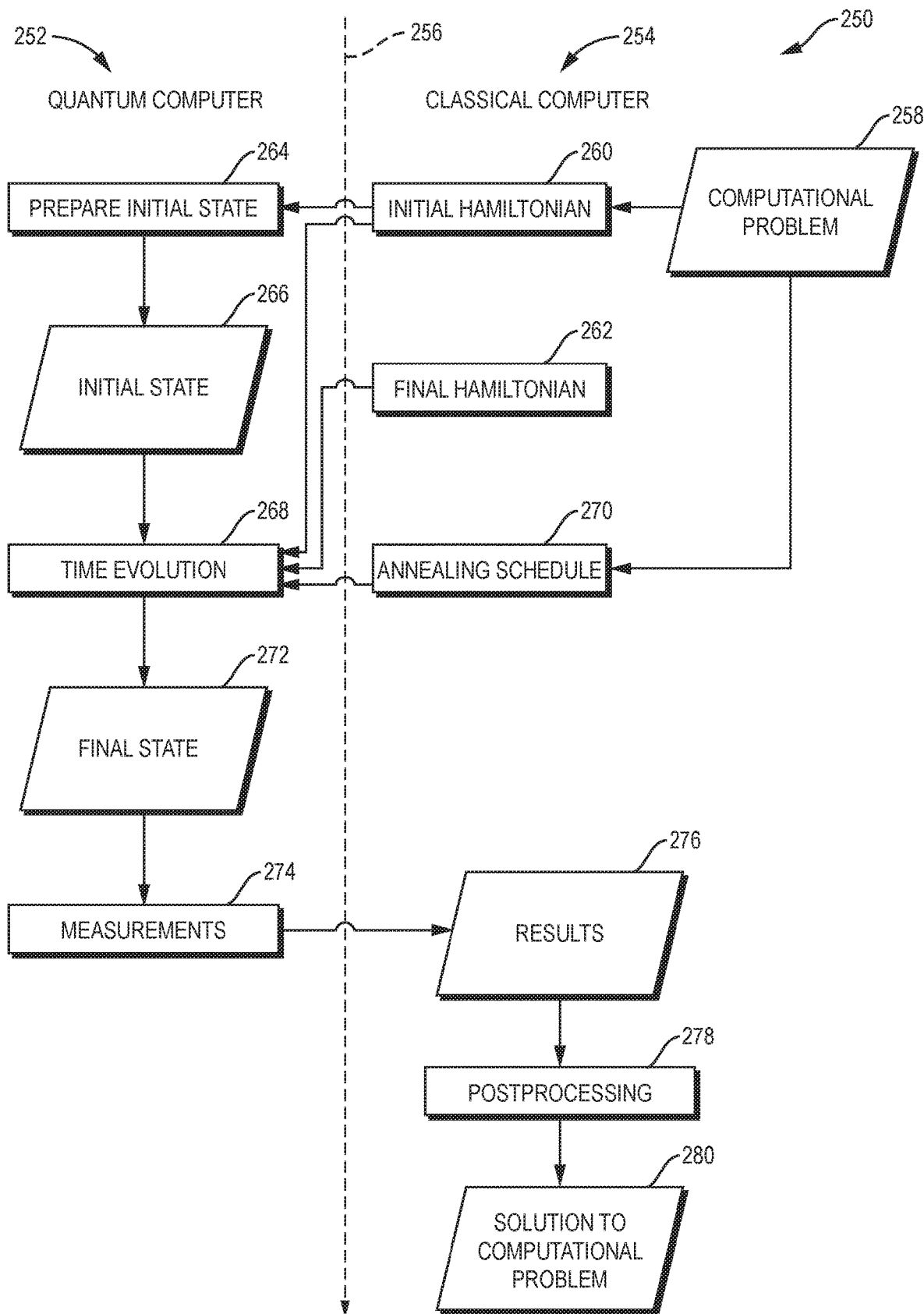
FIG. 2B is a diagram of a hybrid quantum-classical computer which performs quantum annealing according to one embodiment of the present invention.

FIG. 2B shows a diagram illustrating operations typically performed by a computer system 250 which implements quantum annealing. The system 250 includes both a quantum computer 252 and a classical computer 254. Operations shown on the left of the dashed vertical line 256 typically are performed by the quantum computer 252, while operations shown on the right of the dashed vertical line 256 typically are performed by the classical computer 254.

Quantum annealing starts with the classical computer 254 generating an initial Hamiltonian 260 and a final Hamiltonian 262 based on a computational problem 258 to be solved, and providing the initial Hamiltonian 260, the final Hamiltonian 262 and an annealing schedule 270 as input to the quantum computer 252. The quantum computer 252 prepares a well-known initial state 266 (FIG. 2B, operation 264), such as a quantum-mechanical superposition of all possible states (candidate states) with equal weights, based on the initial Hamiltonian 260. The classical computer 254 provides the initial Hamiltonian 260, a final Hamiltonian 262, and an annealing schedule 270 to the quantum computer 252. The quantum computer 252 starts in the initial state 266, and evolves its state according to the annealing schedule 270 following the time-dependent Schrodinger equation, a natural quantum-mechanical evolution of physical systems (FIG. 2B, operation 268). More specifically, the state of the quantum computer 252 undergoes time evolution under a time-dependent Hamiltonian, which starts from the initial Hamiltonian 260 and terminates at the final Hamiltonian 262. If the rate of change of the system Hamiltonian is slow enough, the system stays close to the ground state of the instantaneous Hamiltonian. If the rate of change of the system Hamiltonian is accelerated, the system may leave the ground state temporarily but produce a higher likelihood of concluding in the ground state of the final problem Hamiltonian, i.e., diabatic quantum computation. At the end of the time evolution, the set of qubits on the quantum annealer is in a final state 272, which is expected to be close to the ground state of the classical Ising model that corresponds to the solution to the original optimization problem. An experimental demonstration of the success of quantum annealing for random magnets was reported immediately after the initial theoretical proposal.

The final state 272 of the quantum computer 252 is measured, thereby producing results 276 (i.e., measurements) (FIG. 2B, operation 274). The measurement operation 274 may be performed, for example, in any of the ways disclosed herein, such as in any of the ways disclosed herein in connection with the measurement unit 110 in FIG. 1. The classical computer 254 performs postprocessing on the measurement results 276 to produce output 280 representing a solution to the original computational problem 258 (FIG. 2B, operation 278).

As yet another alternative example, embodiments of the present invention may be implemented, in whole or in part, using a quantum computer that is implemented using a one-way quantum computing architecture, also referred to as a measurement-based quantum computing architecture, which is another alternative to the gate model quantum computing architecture. More specifically, the one-way or measurement based quantum computer (MBQC) is a method of quantum computing that first prepares an entangled resource state, usually a cluster state or graph state, then performs single qubit measurements on it. It is "one-way" because the resource state is destroyed by the measurements.

The outcome of each individual measurement is random, but they are related in such a way that the computation always succeeds. In general the choices of basis for later measurements need to depend on the results of earlier measurements, and hence the measurements cannot all be performed at the same time.

Any of the functions disclosed herein may be implemented using means for performing those functions. Such means include, but are not limited to, any of the components disclosed herein, such as the computer-related components described below.

Figure 1:
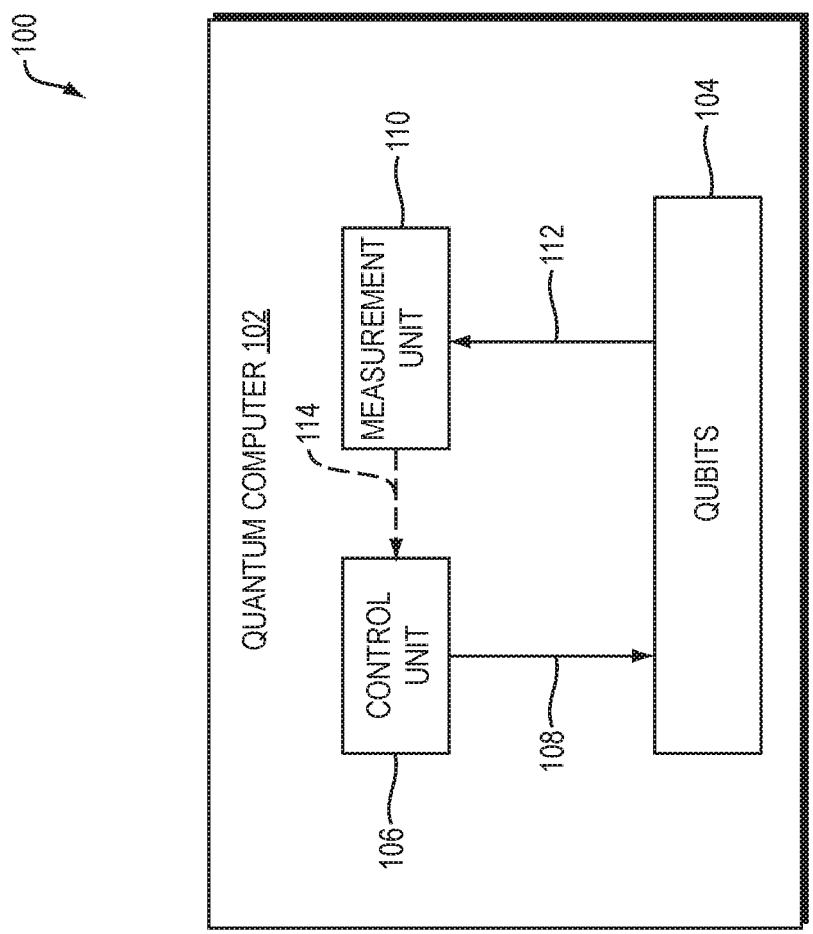
FIG. 1 is a diagram of a quantum computer according to one embodiment of the present invention.

Referring to FIG. 1, a diagram is shown of a system 100 implemented according to one embodiment of the present invention. Referring to FIG. 2A, a flowchart is shown of a method 200 performed by the system 100 of FIG. 1 according to one embodiment of the present invention. The system 100 includes a quantum computer 102. The quantum computer 102 includes a plurality of qubits 104, which may be implemented in any of the ways disclosed herein. There may be any number of qubits 104 in the quantum computer 102. For example, the qubits 104 may include or consist of no more than 2 qubits, no more than 4 qubits, no more than 8 qubits, no more than 16 qubits, no more than 32 qubits, no more than 64 qubits, no more than 128 qubits, no more than 256 qubits, no more than 512 qubits, no more than 1024 qubits, no more than 2048 qubits, no more than 4096 qubits, or no more than 8192 qubits. These are merely examples, in practice there may be any number of qubits 104 in the quantum computer 102.

There may be any number of gates in a quantum circuit. However, in some embodiments the number of gates may be at least proportional to the number of qubits 104 in the quantum computer 102. In some embodiments the gate depth may be no greater than the number of qubits 104 in the quantum computer 102, or no greater than some linear multiple of the number of qubits 104 in the quantum computer 102 (e.g., 2, 3, 4, 5, 6, or 7).

The qubits 104 may be interconnected in any graph pattern. For example, they be connected in a linear chain, a two-dimensional grid, an all-to-all connection, any combination thereof, or any subgraph of any of the preceding.

As will become clear from the description below, although element 102 is referred to herein as a "quantum computer," this does not imply that all components of the quantum computer 102 leverage quantum phenomena. One or more components of the quantum computer 102 may, for example, be classical (i.e., non-quantum components) components which do not leverage quantum phenomena.

The quantum computer 102 includes a control unit 106, which may include any of a variety of circuitry and/or other machinery for performing the functions disclosed herein. The control unit 106 may, for example, consist entirely of classical components. The control unit 106 generates and provides as output one or more control signals 108 to the qubits 104. The control signals 108 may take any of a variety of forms, such as any kind of electromagnetic signals, such as electrical signals, magnetic signals, optical signals (e.g., laser pulses), or any combination thereof.

For example:
In embodiments in which some or all of the qubits 104 are implemented as photons (also referred to as a "quantum optical" implementation) that travel along waveguides, the control unit 106 may be a beam splitter (e.g., a heater or a mirror), the control signals 108 may be signals that control the heater or the rotation of the mirror, the measurement unit 110 may be a photodetector, and the measurement signals 112 may be photons.

In embodiments in which some or all of the qubits 104 are implemented as charge type qubits (e.g., transmon, X-mon, G-mon) or flux-type qubits (e.g., flux qubits, capacitively shunted flux qubits) (also referred to as a "circuit quantum electrodynamic" (circuit QED) implementation), the control unit 106 may be a bus resonator activated by a drive, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as superconducting circuits, the control unit 106 may be a circuit QED-assisted control unit or a direct capacitive coupling control unit or an inductive capacitive coupling control unit, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as trapped ions (e.g., electronic states of, e.g., magnesium ions), the control unit 106 may be a laser, the control signals 108 may be laser pulses, the measurement unit 110 may be a laser and either a CCD or a photodetector (e.g., a photomultiplier tube), and the measurement signals 112 may be photons.

In embodiments in which some or all of the qubits 104 are implemented using nuclear magnetic resonance (NMR) (in which case the qubits may be molecules, e.g., in liquid or solid form), the control unit 106 may be a radio frequency (RF) antenna, the control signals 108 may be RF fields emitted by the RF antenna, the measurement unit 110 may be another RF antenna, and the measurement signals 112 may be RF fields measured by the second RF antenna.

In embodiments in which some or all of the qubits 104 are implemented as nitrogen-vacancy centers (NV centers), the control unit 106 may, for example, be a laser, a microwave antenna, or a coil, the control signals 108 may be visible light, a microwave signal, or a constant electromagnetic field, the measurement unit 110 may be a photodetector, and the measurement signals 112 may be photons.

In embodiments in which some or all of the qubits 104 are implemented as two-dimensional quasiparticles called "anyons" (also referred to as a "topological quantum computer" implementation), the control unit 106 may be nanowires, the control signals 108 may be local electrical fields or microwave pulses, the measurement unit 110 may be superconducting circuits, and the measurement signals 112 may be voltages.

In embodiments in which some or all of the qubits 104 are implemented as semiconducting material (e.g., nanowires), the control unit 106 may be microfabricated gates, the control signals 108 may be RF or microwave signals, the measurement unit 110 may be microfabricated gates, and the measurement signals 112 may be RF or microwave signals.

Although not shown explicitly in FIG. 1 and not required, the measurement unit 110 may provide one or more feedback signals 114 to the control unit 106 based on the measurement signals 112. For example, quantum computers referred to as "one-way quantum computers" or "measurement-based quantum computers" utilize such feedback signals 114 from the measurement unit 110 to the control unit 106. Such feedback signals 114 is also necessary for the operation of fault-tolerant quantum computing and error correction.

The control signals 108 may, for example, include one or more state preparation signals which, when received by the qubits 104, cause some or all of the qubits 104 to change their states. Such state preparation signals constitute a quantum circuit also referred to as an "ansatz circuit." The resulting state of the qubits 104 is referred to herein as an "initial state" or an "ansatz state." The process of outputting the state preparation signal(s) to cause the qubits 104 to be in their initial state is referred to herein as "state preparation" (FIG. 2A, section 206). A special case of state preparation is "initialization," also referred to as a "reset operation," in which the initial state is one in which some or all of the qubits 104 are in the "zero" state i.e. the default single-qubit state. More generally, state preparation may involve using the state preparation signals to cause some or all of the qubits 104 to be in any distribution of desired states. In some embodiments, the control unit 106 may first perform initialization on the qubits 104 and then perform preparation on the qubits 104, by first outputting a first set of state preparation signals to initialize the qubits 104, and by then outputting a second set of state preparation signals to put the qubits 104 partially or entirely into non-zero states.

Another example of control signals 108 that may be output by the control unit 106 and received by the qubits 104 are gate control signals. The control unit 106 may output such gate control signals, thereby applying one or more gates to the qubits 104. Applying a gate to one or more qubits causes the set of qubits to undergo a physical state change which embodies a corresponding logical gate operation (e.g., single-qubit rotation, two-qubit entangling gate or multi-qubit operation) specified by the received gate control signal. As this implies, in response to receiving the gate control signals, the qubits 104 undergo physical transformations which cause the qubits 104 to change state in such a way that the states of the qubits 104, when measured (see below), represent the results of performing logical gate operations specified by the gate control signals. The term "quantum gate," as used herein, refers to the application of a gate control signal to one or more qubits to cause those qubits to undergo the physical transformations described above and thereby to implement a logical gate operation.

It should be understood that the dividing line between state preparation (and the corresponding state preparation signals) and the application of gates (and the corresponding gate control signals) may be chosen arbitrarily. For example, some or all the components and operations that are illustrated in FIGS. 1 and 2A-2B as elements of "state preparation" may instead be characterized as elements of gate application. Conversely, for example, some or all of the components and operations that are illustrated in FIGS. 1 and 2A-2B as elements of "gate application" may instead be characterized as elements of state preparation. As one particular example, the system and method of FIGS. 1 and 2A-2B may be characterized as solely performing state preparation followed by measurement, without any gate application, where the elements that are described herein as being part of gate application are instead considered to be part of state preparation. Conversely, for example, the system and method of FIGS. 1 and 2A-2B may be characterized as solely performing gate application followed by measurement, without any state preparation, and where the elements that are described herein as being part of state preparation are instead considered to be part of gate application.

The quantum computer 102 also includes a measurement unit 110, which performs one or more measurement operations on the qubits 104 to read out measurement signals 112 (also referred to herein as "measurement results") from the qubits 104, where the measurement results 112 are signals representing the states of some or all of the qubits 104. In practice, the control unit 106 and the measurement unit 110 may be entirely distinct from each other, or contain some components in common with each other, or be implemented using a single unit (i.e., a single unit may implement both the control unit 106 and the measurement unit 110). For example, a laser unit may be used both to generate the control signals 108 and to provide stimulus (e.g., one or more laser beams) to the qubits 104 to cause the measurement signals 112 to be generated.

In general, the quantum computer 102 may perform various operations described above any number of times. For example, the control unit 106 may generate one or more control signals 108, thereby causing the qubits 104 to perform one or more quantum gate operations. The measurement unit 110 may then perform one or more measurement operations on the qubits 104 to read out a set of one or more measurement signals 112. The measurement unit 110 may repeat such measurement operations on the qubits 104 before the control unit 106 generates additional control signals 108, thereby causing the measurement unit 110 to read out additional measurement signals 112 resulting from the same gate operations that were performed before reading out the previous measurement signals 112. The measurement unit 110 may repeat this process any number of times to generate any number of measurement signals 112 corresponding to the same gate operations. The quantum computer 102 may then aggregate such multiple measurements of the same gate operations in any of a variety of ways.

After the measurement unit 110 has performed one or more measurement operations on the qubits 104 after they have performed one set of gate operations, the control unit 106 may generate one or more additional control signals 108, which may differ from the previous control signals 108, thereby causing the qubits 104 to perform one or more additional quantum gate operations, which may differ from the previous set of quantum gate operations. The process described above may then be repeated, with the measurement unit 110 performing one or more measurement operations on the qubits 104 in their new states (resulting from the most recently-performed gate operations).

In general, the system 100 may implement a plurality of quantum circuits as follows. For each quantum circuit C in the plurality of quantum circuits (FIG. 2A, operation 202), the system 100 performs a plurality of "shots" on the qubits 104. The meaning of a shot will become clear from the description that follows. For each shot S in the plurality of shots (FIG. 2A, operation 204), the system 100 prepares the state of the qubits 104 (FIG. 2A, section 206). More specifically, for each quantum gate G in quantum circuit C (FIG. 2A, operation 210), the system 100 applies quantum gate G to the qubits 104 (FIG. 2A, operations 212 and 214).

Then, for each of the qubits Q 104 (FIG. 2A, operation 216), the system 100 measures the qubit Q to produce measurement output representing a current state of qubit Q (FIG. 2A, operations 218 and 220).

The operations described above are repeated for each shot S (FIG. 2A, operation 222), and circuit C (FIG. 2A, operation 224). As the description above implies, a single "shot" involves preparing the state of the qubits 104 and applying all of the quantum gates in a circuit to the qubits 104 and then measuring the states of the qubits 104; and the system 100 may perform multiple shots for one or more circuits.

Figure 3:
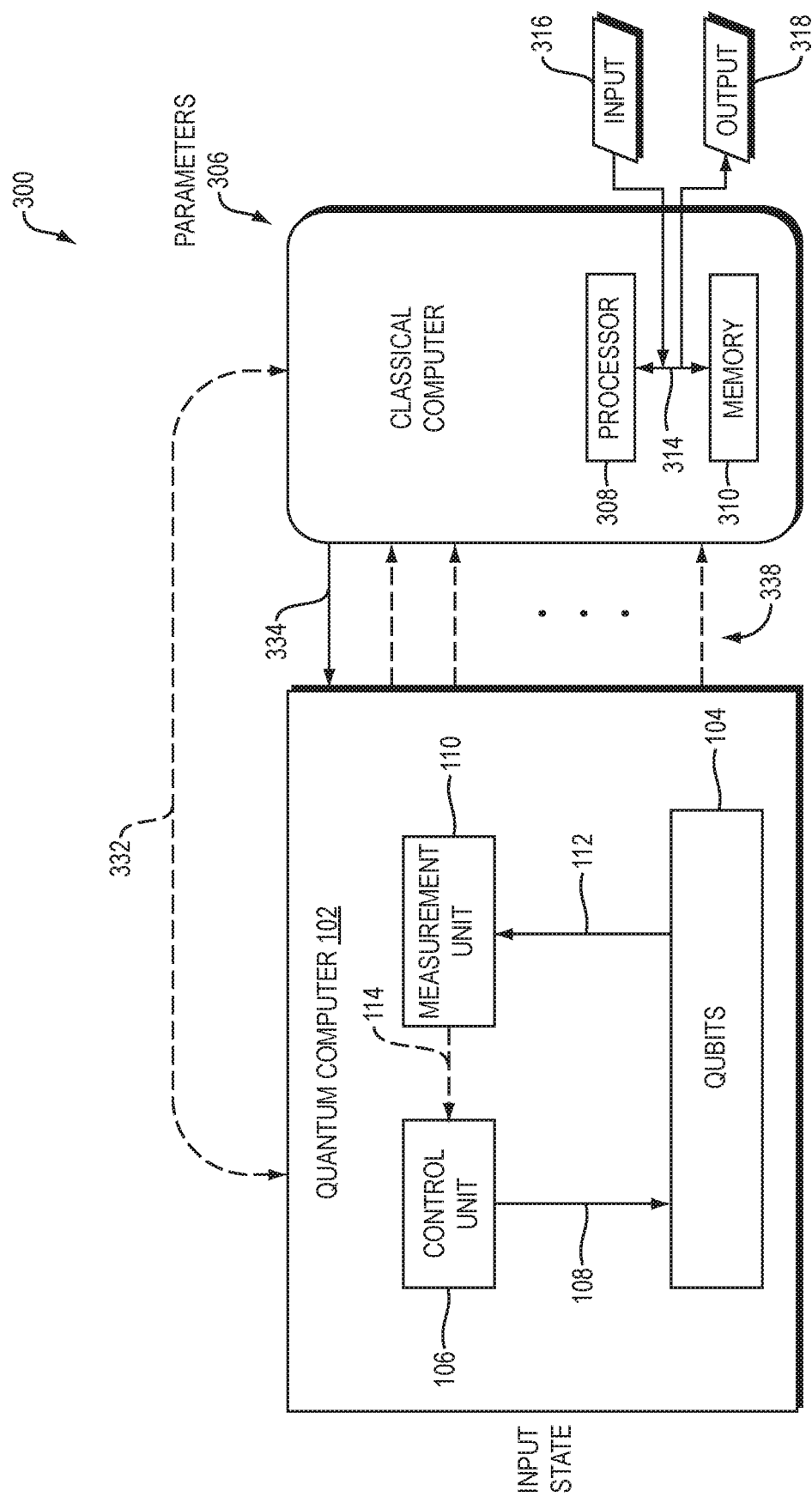
FIG. 3 is a diagram of a hybrid quantum-classical computer according to one embodiment of the present invention.

Referring to FIG. 3, a diagram is shown of a Hybrid quantum-classical (HQC) computer 300 implemented according to one embodiment of the present invention. The HQC 300 includes a quantum computer component 102 (which may, for example, be implemented in the manner shown and described in connection with FIG. 1) and a classical computer component 306. The classical computer component may be a machine implemented according to the general computing model established by John Von Neumann, in which programs are written in the form of ordered lists of instructions and stored within a classical (e.g., digital) memory 310 and executed by a classical (e.g., digital) processor 308 of the classical computer. The memory 310 is classical in the sense that it stores data in a storage medium in the form of bits, which have a single definite binary state at any point in time. The bits stored in the memory 310 may, for example, represent a computer program. The classical computer component 304 typically includes a bus 314. The processor 308 may read bits from and write bits to the memory 310 over the bus 314. For example, the processor 308 may read instructions from the computer program in the memory 310, and may optionally receive input data 316 from a source external to the computer 302, such as from a user input device such as a mouse, keyboard, or any other input device. The processor 308 may use instructions that have been read from the memory 310 to perform computations on data read from the memory 310 and/or the input 316, and generate output from those instructions. The processor 308 may store that output back into the memory 310 and/or provide the output externally as output data 318 via an output device, such as a monitor, speaker, or network device.

The quantum computer component 102 may include a plurality of qubits 104, as described above in connection with FIG. 1. A single qubit may represent a one, a zero, or any quantum superposition of those two qubit states. The classical computer component 304 may provide classical state preparation signals Y32 to the quantum computer 102, in response to which the quantum computer 102 may prepare the states of the qubits 104 in any of the ways disclosed herein, such as in any of the ways disclosed in connection with FIGS. 1 and 2A-2B.

Once the qubits 104 have been prepared, the classical processor 308 may provide classical control signals Y34 to the quantum computer 102, in response to which the quantum computer 102 may apply the gate operations specified by the control signals Y32 to the qubits 104, as a result of which the qubits 104 arrive at a final state. The measurement unit 110 in the quantum computer 102 (which may be implemented as described above in connection with FIGS. 1 and 2A-2B) may measure the states of the qubits 104 and produce measurement output Y38 representing the collapse of the states of the qubits 104 into one of their eigenstates. As a result, the measurement output Y38 includes or consists of bits and therefore represents a classical state. The quantum computer 102 provides the measurement output Y38 to the classical processor 308. The classical processor 308 may store data representing the measurement output Y38 and/or data derived therefrom in the classical memory 310.

The steps described above may be repeated any number of times, with what is described above as the final state of the qubits 104 serving as the initial state of the next iteration. In this way, the classical computer 304 and the quantum computer 102 may cooperate as co-processors to perform joint computations as a single computer system.

Although certain functions may be described herein as being performed by a classical computer and other functions may be described herein as being performed by a quantum computer, these are merely examples and do not constitute limitations of the present invention. A subset of the functions which are disclosed herein as being performed by a quantum computer may instead be performed by a classical computer. For example, a classical computer may execute functionality for emulating a quantum computer and provide a subset of the functionality described herein, albeit with functionality limited by the exponential scaling of the simulation. Functions which are disclosed herein as being performed by a classical computer may instead be performed by a quantum computer.

The techniques described above may be implemented, for example, in hardware, in one or more computer programs tangibly stored on one or more computer-readable media, firmware, or any combination thereof, such as solely on a quantum computer, solely on a classical computer, or on a Hybrid quantum-classical (HQC) computer. The techniques disclosed herein may, for example, be implemented solely on a classical computer, in which the classical computer emulates the quantum computer functions disclosed herein.

The techniques described above may be implemented in one or more computer programs executing on (or executable by) a programmable computer (such as a classical computer, a quantum computer, or an HQC) including any combination of any number of the following: a processor, a storage medium readable and/or writable by the processor (including, for example, volatile and non-volatile memory and/or storage elements), an input device, and an output device. Program code may be applied to input entered using the input device to perform the functions described and to generate output using the output device.

Embodiments of the present invention include features which are only possible and/or feasible to implement with the use of one or more computers, computer processors, and/or other elements of a computer system. Such features are either impossible or impractical to implement mentally and/or manually. For example, embodiments of the present invention include a quantum processing unit (QPU), which includes physical hardware for realizing quantum computation, such as ion traps, superconducting circuits, or photonic circuits. The functions performed by such a QPU are not capable of being emulated manually or mentally, except possible for trivial computations. Furthermore, embodiments of the present invention operate in the supremacy regime, which, by definition, involves performing computations which cannot practically be performed by a classical computer, much less by a human mentally or manually.

Any claims herein which affirmatively require a computer, a processor, a memory, or similar computer-related elements, are intended to require such elements, and should not be interpreted as if such elements are not present in or required by such claims. Such claims are not intended, and should not be interpreted, to cover methods and/or systems which lack the recited computer-related elements. For example, any method claim herein which recites that the claimed method is performed by a computer, a processor, a memory, and/or similar computer-related element, is intended to, and should only be interpreted to, encompass methods which are performed by the recited computer-related element(s). Such a method claim should not be interpreted, for example, to encompass a method that is performed mentally or by hand (e.g., using pencil and paper). Similarly, any product claim herein which recites that the claimed product includes a computer, a processor, a memory, and/or similar computer-related element, is intended to, and should only be interpreted to, encompass products which include the recited computer-related element(s). Such a product claim should not be interpreted, for example, to encompass a product that does not include the recited computer-related element(s).

In embodiments in which a classical computing component executes a computer program providing any subset of the functionality within the scope of the claims below, the computer program may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor, which may be either a classical processor or a quantum processor. Method steps of the invention may be performed by one or more computer processors executing a program tangibly embodied on a computer-readable medium to perform functions of the invention by operating on input and generating output. Suitable processors include, by way of example, both general and special purpose microprocessors. Generally, the processor receives (reads) instructions and data from a memory (such as a read-only memory and/or a random access memory) and writes (stores) instructions and data to the memory. Storage devices suitable for tangibly embodying computer program instructions and data include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (Field-Programmable Gate Arrays). A classical computer can generally also receive (read) programs and data from, and write (store) programs and data to, a non-transitory computer-readable storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

Any data disclosed herein may be implemented, for example, in one or more data structures tangibly stored on a non-transitory computer-readable medium (such as a classical computer-readable medium, a quantum computer-readable medium, or an HQC computer-readable medium). Embodiments of the invention may store such data in such data structure(s) and read such data from such data structure(s).

What is claimed is:

1. A method for executing a Fermi-Hubbard ansatz on a quantum computer, the quantum computer including a plurality of qubits, the method comprising:

(A) Executing the Fermi-Hubbard ansatz by applying, on the quantum computer, a variational circuit on a plurality P of subsets S of the plurality of qubits, each of the plurality of subsets comprising at least two qubits, wherein executing the circuit comprises, for each subset S:

(A)(1) applying a first set of parametrized single qubit gates to each qubit in the subset S; and (A)(2) applying a transverse interaction and a variational longitudinal interaction on the subset S.

2. The method of claim 1, wherein executing the circuit further comprises:

(A)(3) after (A)(2), applying a second set of parameterized single qubit gates to each qubit in the subset S.

3. The method of claim 1, wherein the plurality P comprises staggered layers of 2-qubit gates.

4. The method of claim 1, further comprising:

(B) after executing the Fermi-Hubbard ansatz, estimating the ground state energy of an electronic structure Hamiltonian to produce an estimate of the ground state energy of an electronic structure Hamiltonian.

5. The method of claim 4, wherein the electronic structure Hamiltonian comprises a 1D Fermi-Hubbard Hamiltonian.

6. The method of claim 5, further comprising:

(C) based on the estimate of the ground state energy of the 1D Fermi-Hubbard Hamiltonian, computing an effective fermionic length of the quantum computer.

7. The method of claim 1, further comprising:

(B) after executing the Fermi-Hubbard ansatz, evaluating the ground state energy of an electronic structure Hamiltonian to produce an evaluation of the ground state energy of the electronic structure Hamiltonian.

8. The method of claim 7, wherein the electronic structure Hamiltonian comprises a 1D Fermi-Hubbard Hamiltonian.

9. The method of claim 8, further comprising:

(C) based on the evaluation of the ground state energy of the 1D Fermi-Hubbard Hamiltonian, computing an effective fermionic length of the quantum computer.

10. The method of claim 1, wherein executing the circuit comprises executing the optimization directly on experimental controls of the quantum computer.

11. A system comprising a non-transitory computer-readable medium having computer program instructions stored thereon, the computer program instructions being executable by at least one processor in a classical computer to control a quantum computer to perform a method for executing a Fermi-Hubbard ansatz, the quantum computer including a plurality of qubits, the method comprising:

(A) executing the Fermi-Hubbard ansatz by applying, on the quantum computer, a variational circuit on a plurality P of subsets S of the plurality of qubits, each of the plurality of subsets comprising at least two qubits, wherein executing the circuit comprises, for each subset S, at the quantum computer:

(A)(1) applying a first set of parametrized single qubit gates to each qubit in the subset S; and (A)(2) applying a transverse interaction and a variational longitudinal interaction on the subset S.

12. The system of claim 11, wherein executing the circuit further comprises, at the quantum computer:

(A)(3) after (A)(2), applying a second set of parameterized single qubit gates to each qubit in the subset S.

13. The system of claim 11, wherein the plurality P comprises staggered layers of 2-qubit gates.

14. The system of claim 11, wherein the method further comprises:
- (B) at the quantum computer, after executing the Fermi-Hubbard ansatz, estimating the ground state energy of an electronic structure Hamiltonian to produce an estimate of the ground state energy of an electronic structure Hamiltonian.

15. The system of claim 14, wherein the electronic structure Hamiltonian comprises a 1D Fermi-Hubbard Hamiltonian.

16. The system of claim 15, wherein the method further comprises:
- (C) at the quantum computer, based on the estimate of the ground state energy of the 1D Fermi-Hubbard Hamiltonian, computing an effective fermionic length of the quantum computer.

17. The system of claim 11, wherein the method further comprises:
- (B) at the quantum computer, after executing the Fermi-Hubbard ansatz, evaluating the ground state energy of an electronic structure Hamiltonian to produce an evaluation of the ground state energy of the electronic structure Hamiltonian.

18. The system of claim 17, wherein the electronic structure Hamiltonian comprises a 1D Fermi-Hubbard Hamiltonian.

19. The system of claim 18, wherein the method further comprises:
- (C) at the quantum computer, based on the evaluation of the ground state energy of the 1D Fermi-Hubbard Hamiltonian, computing an effective fermionic length of the quantum computer.

20. The system of claim 11, wherein executing the circuit comprises executing the optimization directly on experimental controls of the quantum computer.

\* \* \* \* \*